(12) United States Patent
Emami

(10) Patent No.: US 6,459,333 B1
(45) Date of Patent: Oct. 1, 2002

(54) DIFFERENTIATE AND DIVIDE FM DEMODULATOR

(75) Inventor: Shahriar Emami, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/777,199

(22) Filed: Feb. 5, 2001

(51) Int. Cl.$^7$ .............................. H03D 3/00; H04L 27/14
(52) U.S. Cl. ..................... 329/341; 329/300; 329/323; 329/316; 375/324; 375/334; 455/337
(58) Field of Search .................... 329/316, 341–343, 329/300–303, 323–326; 375/324, 334–337; 455/214, 337

(56) References Cited

U.S. PATENT DOCUMENTS 3,609,555 A * 9/1971 Van Blerkem et al. ..... 325/349
4,488,119 A * 12/1984 Marshall ....................... 329/50
4,499,426 A * 2/1985 Parker .......................... 329/50

\* cited by examiner

*Primary Examiner*—David Mis
(74) *Attorney, Agent, or Firm*—Miller, Johnson, Snell & Cummiskey, P.L.C.

(57) ABSTRACT

An FM demodulator in accordance with the present invention receives a composite signal from an antenna and corresponding processing circuitry. The composite signal includes a carrier signal having a voice/data signal modulated thereon. The composite signal is processed to separate the voice/data signal from the carrier signal. The voice/data signal is separated into an in-phase (I) signal and a quadrature (Q) signal. The Q signal is differentiated and then divided by the I signal to obtain the voice/data signal. Alternatively, I signal is differentiated and then divided by the Q signal to obtain the voice/data signal.

29 Claims, 2 Drawing Sheets

DIFFERENTIATE AND DIVIDE FM DEMODULATOR

BACKGROUND OF THE INVENTION

1. Field of the Invention

The present invention relates to two-way radios, pagers and cellular telephones and, more particularly, to demodulating voice/data signals from a carrier signal.

2. Background Art

Digital frequency modulation is popular for radio, pager, and cellular telephone (hereinafter collectively referred to as "radio") applications. A number of different demodulation methods for digital frequency modulation have been proposed. Among the proposed methods, arctangent demodulation is favored in radio applications. Arctangent demodulation, however, is computationally expensive. Specifically, in practice, a digital signal processor (DSP) implementation of an arctangent demodulator is utilized to numerically process digital samples of in-phase and quadrature signals of a voice/data signal demodulated from a composite signal received at the arctangent demodulator, where the composite signal includes a carrier signal having the voice/data signal modulated thereon. The output of the DSP is filtered and amplified to produce the voice/data signal.

In order to process each sample of the in-phase signal (I) and the quadrature signal (Q), the DSP implementation of the arctangent demodulator invokes one division operation, one arctangent operation, and one differentiation operation. Contrary to a multiplication operated by the DSP, however, division and arctangent operations are cycle-intensive operations. For example, the DSP implementation of a typical arctangent demodulator utilizes a seventh order polynomial to compute the arctangent. This seventh order polynomial requires six multiplication operations and three addition operations. Division by the DSP of the arctangent demodulator is implemented by multiplying the numerator by an inverse of the denominator. In order to determine the inverse of the denominator, the DSP utilizes a recursive routine which requires five iterations to produce accurate results. Each iteration of the recursive routine requires four multiplication operations and one addition operation. Lastly, differentiation by the DSP requires one addition operation.

From the foregoing, it can be seen that the DSP of the arctangent demodulator requires a total of twenty-six multiplication operations and nine addition operations in order to process each sample of the in-phase signal and quadrature signal in order to produce the voice/data signal.

Each computational operation executed by the DSP consumes electrical power. Since radios utilize portable rechargeable batteries to power the electronics thereof, it is desirable that such electronics use as little power as possible while providing their intended function in order to maximize the use of energy stored in the portable batteries.

BRIEF DESCRIPTION OF THE DRAWINGS

With reference to FIG. 1, a prior art arctangent FM demodulator 2 includes a first mixer 4 and a second mixer 6 configured to receive from an antenna (not shown), a composite signal including a carrier signal having a voice/data signal modulated thereon. It is to be appreciated that the composite signal received from the antenna can be amplified or otherwise processed prior to being received by first mixer 4 and second mixer 6. First mixer 4 and second mixer 6 are also configured to receive from a local oscillator 8 a first oscillator signal and a second oscillator signal, respectively. Preferably, the first oscillator signal has a waveform of the form:

Figure 1:
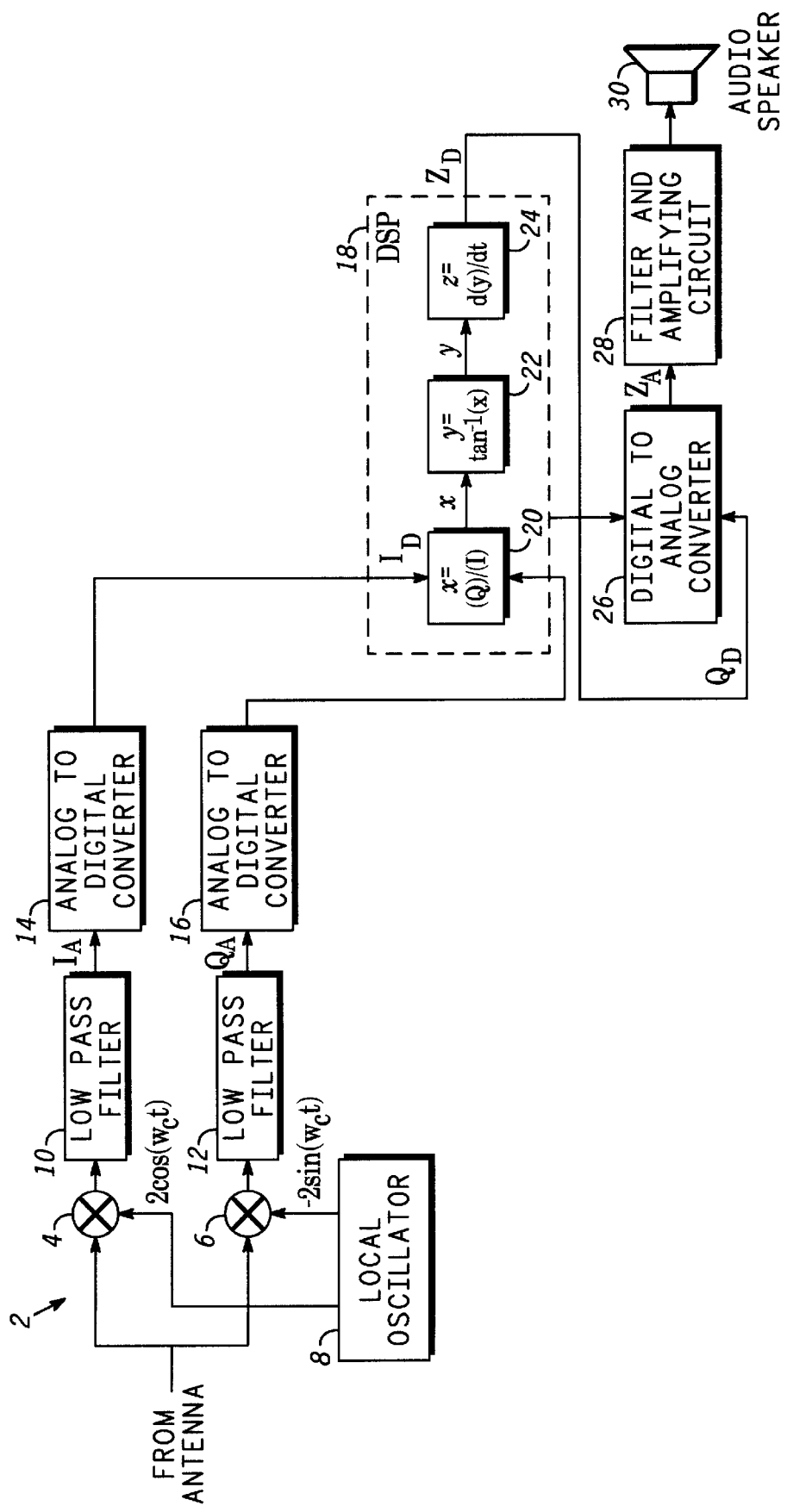
FIG. 1 is a block diagram of a prior art FM demodulator.

$$2 \cos(\omega_c t + \phi) \qquad \text{EQ. 1}$$

Moreover, the second oscillator signal has a waveform of the form:

$$-2 \sin(\omega_c t + \phi) \qquad \text{EQ. 2}$$

First mixer 4 mixes the composite signal and the first oscillator signal to obtain a first mixer signal. Similarly, second mixer 6 mixes the composite signal and the second oscillator signal to obtain a second mixer signal. The first mixer signal is supplied to a LOW PASS filter 10 which filters the first mixer signal to obtain an analog in-phase ($I_A$) signal. The second mixer signal is supplied to a second LOW PASS filter 12 which filters the second mixer signal to obtain an analog quadrature ($Q_A$) signal.

The $I_A$ signal and the $Q_A$ signal are provided to a first analog-to-digital (A/D) converter 14 and a second A/D converter 16, respectively. The first and second A/D converters 14 and 16 convert samples of the $I_A$ signal and the $Q_A$ signal into a digital in-phase ($I_D$) signal and a digital quadrature ($Q_D$) signal.

The $I_A$ signal and the $Q_A$ signal are provided to a first analog-to-digital (A/D) converter 14 and a second A/D converter 16, respectively. The first and second A/D converters 14 and 16 convert samples of the $I_A$ signal and the $Q_A$ signal into a digital in-phase ($I_D$) signal and a digital quadrature ($Q_D$) signal.

DSP 18 processes each sample of the $I_D$ and $Q_D$ signals. More particularly, for each sample of the $I_D$ and $Q_D$ signals, DSP 18 invokes a divide algorithm 20 to divide the value of the $Q_D$ signal by the value of the $I_D$ signal. Thereafter, DSP 18 invokes an arctangent algorithm 22 for determining the arctangent of the solution generated by the divide algorithm 20. Next, DSP 18 invokes a differentiation algorithm 24 to differentiate the solution generated by the arctangent algorithm 22. Lastly, DSP 18 outputs the solution $Z_D$ generated by the differentiation algorithm 24 to a digital-to-analog (D/A) converter 26 for conversion to an equivalent analog signal $Z_A$ under the control of DSP 18. $Z_A$ is then filtered and amplified by filter and amplifying circuit 28 and supplied to an audio speaker 30 for conversion into audible sound.

It is well known in the art that DSP 18 can only perform addition and multiplication. Other operations must be mapped into this basic set of operations to be implemented by DSP 18. For example, divide algorithm 20 is implemented in DSP 18 by multiplying the numerator $Q_D$ by the inverse of the denominator $I_D$.

As is well known in the art, to approximate the inverse of the denominator $I_D$, the DSP 18 utilizes a recursive equation.

It can be shown that the division of the numerator value $Q_D$ by the denominator value $I_D$ requires twenty multiplication operations and six addition operations.

To approximate arctangent algorithm 22, DSP 18 utilizes the following equation:

$$\text{Arctangent}(y) = y(y2(y2((C7)(y2+C5))+C3)+C1) \qquad \text{EQ. 4}$$

where: $C1=0.3180597$;
$C3=-0.1022332$;
$C5=0.0465574$;
$C7=-0.0124098$; and
y=the solution of EQ. 3 after five iterations.

It can be seen that DSP 18 implements six multiplication operations and three addition operations to solve Equation 4.

Lastly, differentiation algorithm 24 requires one addition operation.

From the foregoing, it can be seen that arctangent demodulation requires DSP 18 to implement twenty-six multiplication operations and nine addition operations for each sample of $I_D$ and $Q_D$.

Figure 2:
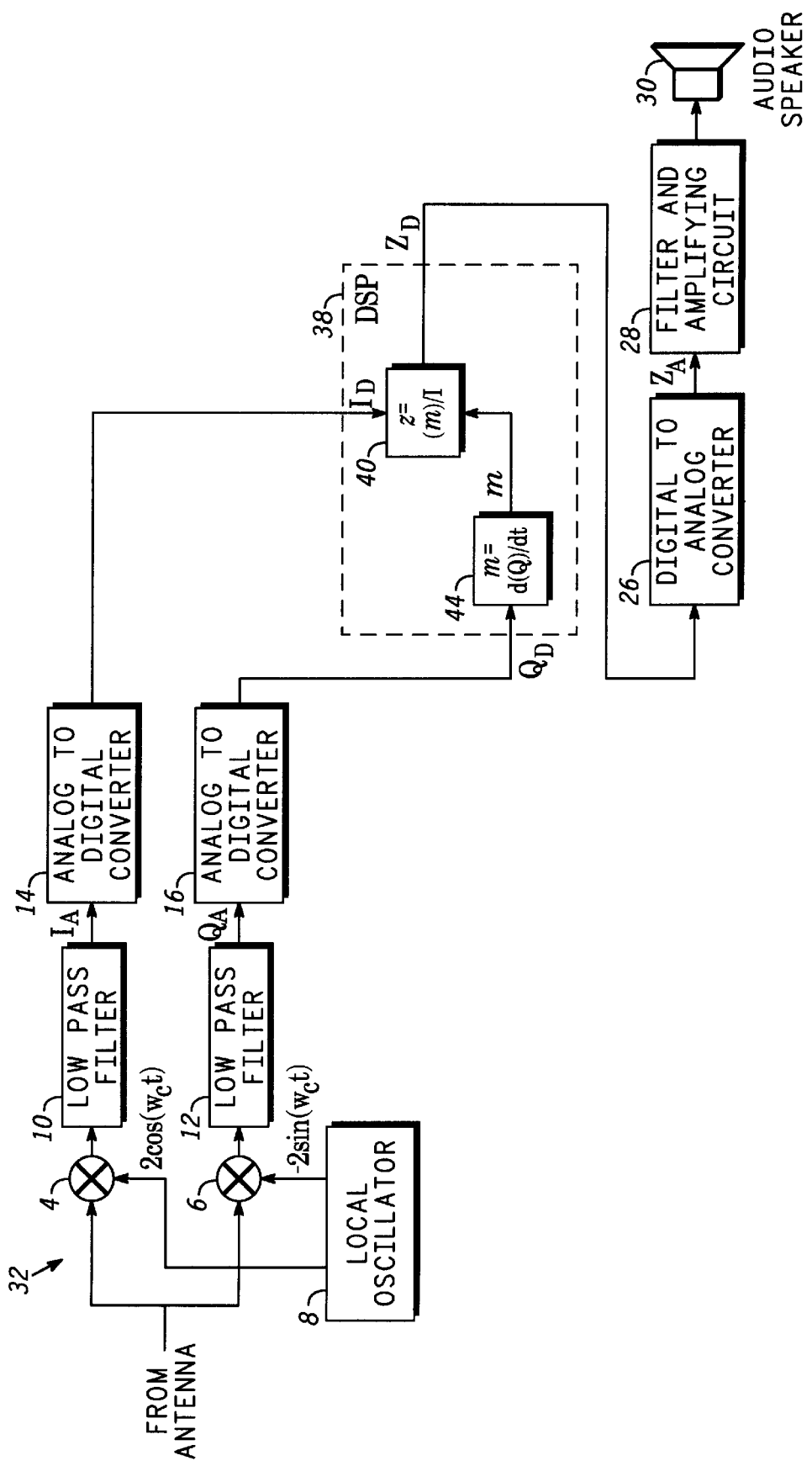
FIG. 2 is a block diagram of an FM demodulator in accordance with the present invention.

With reference to FIG. 2, and with ongoing reference to FIG. 1, a differentiate and divide (DD) demodulator 32 in accordance with the present invention includes first mixer 4, second mixer 6, local oscillator 8, first LOW PASS filter 10, second LOW PASS filter 12, first A/D converter 14, and second A/D converter 16 connected in the same manner as shown in arctangent demodulator 2 of FIG. 1. A DSP 38 is connected to receive from A/D converter 14 and A/D converter 16 digital samples of the $I_D$ signal and $Q_D$ signal, respectively. DSP 38 includes a differentiation algorithm 44, similar to differentiation algorithm 24, and a divide algorithm 40, similar to divide algorithm 20.

In operation, DSP 38 utilizes differentiation algorithm 44 to differentiate the sample of the $Q_D$ signal. Thereafter, DSP 38 utilizes divide algorithm 40 to divide the solution generated by differentiation algorithm 44 by the sample of the $I_D$ signal. Next, DSP 38 outputs the solution $Z_D$ generated by divide algorithm 40 to D/A converter 26 for conversion to an equivalent analog signal $Z_A$ under the control of DSP 38. $Z_A$ is then filtered and amplified by filter and amplifying circuit 28 and supplied to audio speaker 30 for conversion into audible sound.

As discussed above in connection with differentiation algorithm 24 and divide algorithm 20, differentiation algorithm 44 requires one addition operation and divide algorithm 40 requires twenty multiplication operations and five addition operations, for a total of twenty multiplication operations and six addition operations. Thus, in comparison to the number of multiplication operations and addition operations required to be implemented by DSP 18 of arctangent demodulator 2, DD demodulator 32 has about 25% less multiplication operations and 33% less addition operations. Comparing the total number of algorithmic operations implemented by DSPs 18 and 38, it can be seen that DSP 38 implements about 25% less algorithmic operations than DSP 18.

It has been determined that for test tones as well as speech, the output of differentiate and divide demodulator 32 corresponds favorably with the output of arctangent FM demodulator 2. Since, in operation, DSP 38 implements about 25% less algorithmic operations than DSP 18, DSP 38 consumes less electrical power during operation than DSP 18.

The present invention has been described with reference to the preferred embodiment. Obvious modifications and alterations will occur to others upon reading and understanding the preceding detailed description. For example, DSP 38, A/D converters 14 and 16, and D/A converter 26 can be omitted, and divide algorithm 40 and differentiation algorithm 44 can be implemented in analog circuitry or discrete digital circuitry. It is intended that the invention be construed as including all such modifications and alterations insofar as they come within the scope of the appended claims or the equivalents thereof.

What is claimed is:

1. A method of demodulating a voice/data signal from a carrier signal using a discrete time differentiate and divide frequency modulation (FM) demodulator, the method comprising the steps of:
   (a) receiving a composite signal which includes a carrier signal having a voice/data signal modulated thereon;
   (b) processing the composite signal to separate the voice/data signal from the carrier signal, wherein the voice/data signal separated from the carrier signal is separated into a first signal and a second signal;
   (c) differentiating the second signal to obtain a differentiated second signal; and
   (d) dividing the differentiated second signal by the first signal to obtain the voice/data signal.

2. The method as set forth in claim 1, wherein:
   The first signal is an in-phase (I) signal and the second signal is a quadrature (Q) signal.

3. The method as set forth in claim 1, wherein:
   The first signal is quadrature (Q) signal and the second signal is a in-phase (I) signal.

4. The method as set forth in claim 1, wherein step (b) includes the steps of:
   mixing the composite signal and a first oscillator signal to obtain a first mixer signal; and
   mixing the composite signal and a second oscillator signal to obtain a second mixer signal.

5. The method as set forth in claim 4, wherein step (b) further includes the steps of:
   filtering the first mixer signal to obtain the I signal; and
   filtering the second mixer signal to obtain the Q signal.

6. A method as set forth in claim 5 wherein the first mixer signal and the second mixer signal are 90 degrees out of phase.

7. The method as set forth in claim 4, wherein the first oscillator signal has a waveform $2\cos(\omega_c t)$, where "$\omega_c$" is the angular frequency of the carrier signal and "t" is time.

8. The method as set forth in claim 4, wherein the second oscillator signal has a waveform $-2\sin(\omega_c t)$, where "$\omega_c$" is the angular frequency of the carrier signal and "t" is time.

9. The method as set forth in claim 1, wherein step (d) includes multiplying the differentiated Q signal by the inverse of the I signal.

10. The method as set forth in claim 1, further including the steps of:
    converting the I signal into a digital I signal; and
    converting the Q signal into a digital Q signal.

11. The method as set forth in claim 10, wherein:
    step (c) includes differentiating the digital Q signal; and
    step (d) includes dividing the differentiated digital Q signal by the digital I signal to obtain a digital voice/data signal.

12. The method as set forth in claim 11, further including the step of converting the digital voice/data signal into an analog voice/data signal.

13. A discrete time differentiate and divide frequency modulation (FM) demodulator for demodulating a voice/data signal from a carrier signal, the demodulator comprising:
    means for processing a composite signal which includes a carrier signal having a voice/data signal frequency modulated thereon into a first signal and a second signal;
    a differentiator for differentiating the second signal to obtain a differentiated second signal; and a divider for dividing the differentiated second signal by the first signal to obtain the voice/data signal.

14. The method as set forth in claim 13, wherein:
The first signal is an in-phase (I) signal and the second signal is a quadrature (Q) signal.

15. The method as set forth in claim 13, wherein:
The first signal is quadrature (Q) signal and the second signal is a in-phase (I) signal.

16. The demodulator as set forth in claim 13, wherein the means for processing includes:
   a first mixer configured to mix a first oscillator signal and the composite signal to obtain a first mixer signal; and
   a second mixer configured to mix a second oscillator signal and the composite signal to obtain a second mixer signal.

17. The demodulator as set forth in claim 16, wherein the means for processing further includes:
   a first frequency selective filter for filtering the first mixer signal to obtain the I signal;
   a second frequency selective filter for filtering the second mixer signal to obtain the Q signal.

18. The demodulator as set forth in claim 17, wherein the means for processing further includes:
   means for converting the I signal into a digital I signal; and
   means for converting the Q signal into a digital Q signal.

19. The demodulator as set forth in claim 18, wherein:
   the differentiator and the divider are configured to process the digital I signal and the digital Q signal to obtain a digital form of the voice/data signal; and
   a means for converting is provided for converting the digital form of the voice/data signal into an analog voice/data signal.

20. The demodulator as set forth in claim 18, wherein the differentiator and the divider are implemented in digital circuitry as a differentiation algorithm and the divide algorithm, respectively.

21. A discrete time defferentiate and divide frequency modulation (FM) demodulator for demodulating a voice/data signal from a carrier signal, the demodulator comprising:
   means for receiving a composite signal which includes a carrier signal having a voice/data signal modulated thereon;
   means for processing the composite signal to separate the voice/data signal from the carrier signal, wherein the voice/data signal separated from the carrier signal is separated into a first signal and a second signal;
   means for differentiating the second signal to obtain a differentiated second signal; and
   means for dividing the differentiated second signal by the first signal to obtain the voice/data signal.

22. The method as set forth in claim 21, wherein:
The first signal is an in-phase (I) signal and the second signal is a quadrature (Q) signal.

23. The method as set forth in claim 21, wherein:
The first signal is quadrature (Q) signal and the second signal is a in-phase (I) signal.

24. The demodulator as set forth in claim 21, wherein the means for processing includes:
   means for mixing the composite signal and a first oscillator signal to obtain a first mixer signal; and
   means for mixing the composite signal and a second oscillator signal to obtain a second mixer signal.

25. The demodulator as set forth in claim 24, wherein the means for processing further includes:
   means for filtering the first mixer signal to obtain the I signal; and
   means for filtering the second mixer signal to obtain the Q signal.

26. The demodulator as set forth in claim 21, further including:
   means for converting the I signal into a digital I signal; and
   means for converting the Q signal into a digital Q signal.

27. The demodulator as set forth in claim 26, further including:
   means for differentiating the digital Q signal; and
   means for dividing the differentiated digital Q signal by the digital I signal to obtain a digital voice/data signal.

28. The demodulator as set forth in claim 26, further including:
   means for differentiating the digital I signal; and
   means for dividing the differentiated digital I signal by the digital Q signal to obtain a digital voice/data signal.

29. The demodulator as set forth in claim 21, further including means for converting the digital voice/data signal into an analog voice/data signal.

* * * * *